United States Patent
Khoche et al.

(10) Patent No.: US 6,360,344 B1
(45) Date of Patent: Mar. 19, 2002

(54) BUILT IN SELF TEST ALGORITHM THAT EFFICIENTLY DETECTS ADDRESS RELATED FAULTS OF A MULTIPORT MEMORY WITHOUT DETAILED PLACEMENT AND ROUTING INFORMATION

(75) Inventors: Ajay Khoche, Sunnyvale; Timothy Ayres, Milpitas, both of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/224,137

(22) Filed: Dec. 31, 1998

(51) Int. Cl.[7] .............................................. G01R 31/28
(52) U.S. Cl. ...................................................... 714/733
(58) Field of Search ............................... 714/718, 733; 365/201

(56) References Cited

U.S. PATENT DOCUMENTS

| 5,896,330 A | * | 4/1999 | Gibson ....................... 365/201 |
| 5,812,469 A | * | 5/2000 | Nadeau-Dostie et al. ... 365/201 |
| 6,070,256 A | * | 5/2000 | Wu et al. .................... 714/718 |

OTHER PUBLICATIONS

Matsumura, T, An Efficient Test Method for Embedded Multi–port RAM with BIST Circuitry, IEEE, p. 62–67, May 1995.*

Nadeau–Dostie et al., Serial Interfacing for Embedded Memory Testing, IEEE, p. 52–63, 1990.*

* cited by examiner

Primary Examiner—Albert DeCady
Assistant Examiner—Shelly A Chase
(74) Attorney, Agent, or Firm—Wagner, Murabito & Hao LLP

(57) ABSTRACT

In a multiport memory semiconductor integrated circuit, an efficient method of testing the memory for faults. The method determines a base address in a multiport memory. A plurality of addresses are scanned within the memory which are at a hamming distance of 1 from the base address, such that at least two memory cells in each column of the multiport memory device are accessed in the scan. This allows the detection of cross port faults, address mismatch faults, and bit shorts due to the fact that the faults are exposed when the two memory cells sharing access columns are accessed with test data. The method functions nominally without requiring any detailed information about the placement and routing structure of the multiport memory device.

24 Claims, 15 Drawing Sheets ( CDF_E )

R10

R20

R11

R21

R12, R22

( CDF_F )

R10 →           ← R20

R11 →           ← R21

R12 →           ← R22

( ADDRESS MISMATCH )

900

1. b = 0;
2. FOR (i = 0 to N-1)
3. W1 ( b,i );
4. FOR (i = 0 to N - 1)
5. {W1 (b, i);
6.     (R1 ($\bar{b}$, i), R2 ($\bar{b}$, i) ):
7.     FOR (j = 0 to ($\log_2$N-1))
8.        { NewAddr = (i with jth bit flipped);
9.           { R1 (b, i), R2 (b, NewAddr));
10.       }
11.    W1 (b,i)
12. }
13. IF (b = 0) {b = 1; GOTO 2;}
14. ELSE END;

FIGURE 11

BUILT IN SELF TEST ALGORITHM THAT EFFICIENTLY DETECTS ADDRESS RELATED FAULTS OF A MULTIPORT MEMORY WITHOUT DETAILED PLACEMENT AND ROUTING INFORMATION

FIELD OF THE INVENTION

The field of the present invention pertains to built in self testing of memory integrated circuits. More particularly, the present invention pertains to a method and system for an efficient built in test of the addressing circuits of a memory integrated circuit to detect cross port faults, bit shorts, and address mismatch faults, and the like.

BACKGROUND OF THE INVENTION

Computer systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these computer and software implemented systems and processes become more powerful, detecting and correcting flaws within the systems becomes increasingly difficult.

As integrated circuits, and particularly memory integrated circuits, have become more complex and more dense, they have become progressively harder to test in order to ensure correct and complete functionality. For example, with current technology, as memory size increases, the time which a memory integrated circuit (e.g., DRAM) emerging from a fabrication process line spends in testing increases as well. This increase incurs an additional cost on DRAM manufacturing.

DRAM devices are achieving greater and greater densities. Higher densities are achieved by reducing the amount of space between memory cells which comprise the DRAM integrated circuit. As such, the place and route tolerances for the integrate circuit are reduced, and the potential for introducing errors and introducing structural faults in the circuit itself increases.

The testing cost can be very significant for the latest and largest high density DRAM integrated circuits. This is particularly true in the case of multiport memory integrated circuits, and especially so with multiport memories embedded within logic chips. High density, embedded multiport memory integrated circuits are among the more expensive integrated circuits to produce. Additionally, the nature of the faults encountered in such high density integrated circuits requires the use of sophisticated algorithms in order to ensure adequate error detection. The complicated placement of the internal structure of high density integrated circuits also greatly increases the difficulty detecting the above types of faults.

For example, and the case of a high density multiport memory device, the highly complex internal structure of the integrate circuit, e.g., the complex place and route structure, increases the likelihood of the introduction of cross port faults, bit storage faults, and address mismatch type faults. Testing of these types of memory devices require simultaneous access of the memory cells of the device in a specific pattern, across specific ports. The intricacies of the pattern used in accessing memory cells to implement testing routines is largely determined through analysis of the place and route information used in fabricating the memory device. Using such information, specialized algorithms access the memory cells in a specific pattern, in accordance with the place and route information for the particular types of devices, to determine whether structural faults between the closely spaced memory cells (e.g., such as a bit short, or the like) exist.

High density multiport memories are becoming more common among computer systems. This is especially true in the field of telecommunications applications. The incorporation of multiple access ports provides greater flexibility in the design of applications which require large amounts of storage. Multiple access ports in memory devices provide new opportunities for system designers to add functionality and flexibility to computer system designs. An unfortunate drawback, however, is the fact that such multiport designs increased complexity of the internal wiring of the memory devices (e.g., the place and route structure). As described above, closely packed memory cells and closely packed wiring access increases the occurrence of certain types of faults. These faults are briefly described below.

One type of faults is referred to as "cross port" decoder faults. These are faults between the decoder of two ports of a memory integrated circuit device. Another type of fault is referred to as "bit short" faults. These are faults between bit lines of two ports. "Address mismatch faults" are due to non-identical mapping of logical addresses to physical memory cells on two ports of a multiport memory integrated circuit device.

Other types of faults include "contention logic" faults, which referred to faults in the circuits inside a memory device that arbitrates simultaneous request write requests on the same memory cells. "Complex Coupling" faults are the faults which can occur due to simultaneous access of different memory cells through different ports that can disturb the contents of one or more neighboring memory cells (e.g., these faults can be both static and dynamic).

The emergence of high density multiport memory devices and logic type integrated circuits which include one or more embedded multiport memories thus require new methods and new systems for testing the devices as they emerge from fabrication. Past testing techniques are proving inadequate. For example, complex coupling faults do not exist in single port type memory devices, and hence, the vast majority of prior art algorithms designed to test for the presence of single port faults are not even applicable for testing for complex coupling faults, let alone being able to reliably detect them.

Technology for testing multiport memories has not been thoroughly developed in the current prior art. One prior art technique addressed testing multiport memories by accessing the memory ports through external connections. The problem with this approach is that external access to the address ports cannot be assumed to always be available (e.g., as is the case where an embedded memory has no direct access from chip I/O pins to its ports). Another past technique involves the use of serial type algorithms, wherein single port memory type tests are repeated for each port, for the case of embedded dual port memories.

Another prior art technique for testing shorts between bit and word lines involves the use of special shadow write operations designed to meet the requirement of activating same two cells in the same physical columns. This assumes the knowledge of the physical placement of the rows and columns of the integrate circuit (e.g., the place and route structure), which may not always be available to the designer. Yet another prior art technique introduced a new coupling fault model called "complex coupling" in the dual-port memories which takes into account effect on a third cell of simultaneous accesses in two other cells. The problem with a solution is that it also assumes some topological restrictions and knowledge of physical placement of cells in the memory.

Yet another prior art technique proposes another fault model to account for the effects of simultaneous access of multiple cells in the neighborhood onto the base cells. This technique uses a "O(sqrt(N)" algorithm to test for these faults. This technique also assumes a specific placement of the cells in the memory and modifies the input to the decoders of the memory device to achieve this low complexity. This technique is capable of testing for the existence of cross-port decoder and address mismatch faults, however, knowledge of physical placement of cells in the memory device is required in order to detect these types of faults .

Thus, in summary, of the specific types of faults encountered in the design in fabrication of multiport memory devices, cross port faults and bit shorts are the only types usually addressed. To detect even these two types of faults, the above prior art techniques need to assume the knowledge of the physical placement of cells in the memory. If this information is not available, testing for these types fault becomes highly problematic. In such a case, testing for these faults require simultaneous access of memory cells in a specific pattern. One would have to apply all possible access patterns to meet the conditions for testing these faults and a "GalPat" like algorithm, which has a complexity of O(n**2), would be required. In addition, one would have to repeat this algorithm for each pair of ports.

Thus, what is required are new methods and testing schemes for testing multiport memories for the existence of the above types of faults. What is needed is a method for testing high density multiport memory devices in an efficient manner. What is needed is a method and system which allows testing of multiport memory devices without requiring prior knowledge of the physical place and route structure of the memory device. Particularly, what is further needed is an algorithm which tests for cross port decoder faults and bit shorts and has a complexity of "O(NlogN)", and is not assumed any knowledge of the physical placement of the cells within the memory device. The present invention provides a novel solution to the above requirements.

SUMMARY OF THE INVENTION

The present invention provides new methods and testing schemes for testing multiport memories for the existence of the above types of faults. The present invention provides a method for testing high density multiport memory devices in an efficient manner. The present invention provides a method and system which allows testing of multiport memory devices without requiring prior knowledge of the physical place and route structure of the memory device. The present invention further provides an algorithm which tests for cross port decoder faults and bit shorts and has a complexity of "O(NlogN)", and is not assumed any knowledge of the physical placement of the cells within the memory device.

In one embodiment, the present invention comprises an efficient algorithm for testing mult-port memories. The algorithm determines a base address in a multiport memory. A plurality of addresses are scanned (that is, read out from) within the memory which are at a hamming distance of 1 from the base address, such that throughout the memory device, at least two memory cells in each column of the memory device are accessed in the scan. This allows the detection of cross port faults, address mismatch faults, and bit shorts due to the fact that the faults are exposed when the two memory cells sharing access columns are accessed with test data.

In this manner, the algorithm of the present invention targets the various types of cross-port decoder faults, address mismatch faults, and bit shorts in multiport memories. This algorithm does not need any information on row/column/block placement in the memory. This characteristic makes the algorithm particularly flexible, greatly enhancing its usefulness in application to the many different design environments in which this information is not available. The fact that detailed place and route information is not available in many applications renders many prior art testing algorithms inapplicable (because those algorithms assume availability of information on the placement of rows/columns/blocks). The complexity of the algorithm of the present invention is "O(NLogN)", which may appear to be high compared to "O(N) March" algorithms. However, in those cases where LogN is computed for memories with 32 bit address space, it is just 32N. So the algorithm of the present invention is still much more practical than prior art algorithms. The hardware implementation of the algorithm is also amenable to BIST implementations. In this manner, the present invention provides a testing algorithm which reliably tests high density multiport memory devices in a fast and efficient manner.

BRIEF DESCRIPTION OF THE DRAWINGS

The present invention is illustrated by way of example and not by way of limitation, in the figures of the accompanying drawings and in which like reference numerals refer to similar elements and in which:

FIG. 11 shows a pseudo code implementation of an algorithm in accordance with one embodiment of the present invention.

DETAILED DESCRIPTION OF THE INVENTION

Figure 1A:
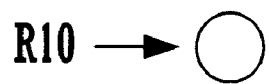
FIG. 1A shows a cross port data error of a first type, of which the present invention is designed to detect.
Figure 1A:
Figure 1A:
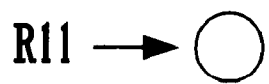
Figure 1A:
Figure 1A:

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not unnecessarily to obscure aspects of the present invention.

The present invention provides algorithm which tests for cross port decoder faults and bit shorts and has complexity of "O(NlogN)" and does not assume any knowledge of physical placement of cells (e.g., the place and route structure) in a memory.

In the discussions which follow, multiport memories, as determined used herein, are formally defined followed by a description of target faults and a set of associate conditions which need to be met in order to detect the particular target faults. The operation of the algorithm of the present invention is subsequently discussed along with a description of how algorithm of the present invention satisfies the conditions for detecting target faults. And implementation of the present invention in a built-in self test environment (e.g., as implemented in a logic integrated circuit device containing embedded RAM structures) is then described.

In accordance with the present invention, a multiport memory is defined as a memory which has more than one address port and more than 1 input and/or output ports. As is well known by those skilled in the art, control ports (e.g. Read Enable, Write Enable etc.) in a multiport memory may be shared among the multiple address ports and/or output ports or distributed. In general, within a given multiport memory device, a subset of control ports of such a device are shared and the rest distributed.

In most cases, each data input port can be associated with exactly one address port and exactly one set of control ports. Similarly, each data output port can be associated with exactly one address port and exactly one set of control ports. Simultaneous access of more than one distinct data word is possible by applying different addresses in the different address ports and applying appropriate control sequence. Moreover, simultaneous read of the same data word is allowed. Simultaneous write access to the same data word may result in inconsistencies in the memory if proper arbitration logic is not provided.

As described above, the presence of more than one port in a multiport memory results in the occurrence of certain types of faults which are not possible in single port memories. The faults which are unique to only multiport memories are hereafter referred to as multiport faults. Primarily, the present invention is described herein in the detection of the existence of multiport faults including cross port decoder faults, address mismatch faults, and bit short faults. These faults and their characteristics are further described below along with their effects and conditions for testing them.

Multiport Decoder Faults

In the case of multiport decoder faults, as is well known by those skilled in the art, the presence of more than one address port causes faults due to interference between decoders of the ports. These faults are also called cross-port decoder faults. The cross-port decoder faults include cases where:

1. An address of one port accesses a row(column) line belonging to the other port.
2. Address mismatch faults, where the same address to both the ports selects non-matching row (column) lines.

Various scenarios are possible with the above two conditions. These cases are shown symbolically in FIGS. 1A through 1E. In the following and the other figures in this section "Rij" means Row decoder line of "i"th port for "j"th physical cell row. More detailed discussions of these fault cases are given below.

Referring now to FIG. 1A, a cross port data type E (CDF E) is shown. CDF_E is the case where a row wire of one decoder (e.g., R12 out of row wires R10–R22), instead of connecting to its own row wire, connects to the row wire of some other port in the same row address (e.g., R22). This fault renders the cells in that row inaccessible using the respective port (R12). The condition for detection of this fault is that when a value written into a cell, the reading of same value from that location fails. In accordance with present invention, this fault can be detected by a applying following test to all the ports. It should be repeated for both values (0 and1).

1. Write a value
2. Read it back.

The effect of this fault will be that the expected bit line will not be active.

Figure 1B:
FIG. 1B shows a cross port data error of a second type, of which the present invention is designed to detect.
Figure 1B:
Figure 1B:
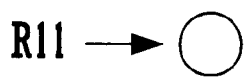
Figure 1B:
Figure 1B:
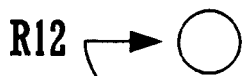
Figure 1B:

Referring to fault CDF_F of FIG. 1B, the row wire of a port (e.g., R12) also connects to the row wire of the other port (R22) in the same physical row of cells in addition to its correct connection. This fault improperly enables cells in the affected row on both the bit lines whenever a cell in that row is accessed using the coupling port. In accordance with present invention, testing for this fault requires reading two cells (one of which is from the affected row) with different values in a bit column. Reading these two cells will disturb the value read on one of the ports. This test should be repeated with the value in two cells switched.

Figure 1C:
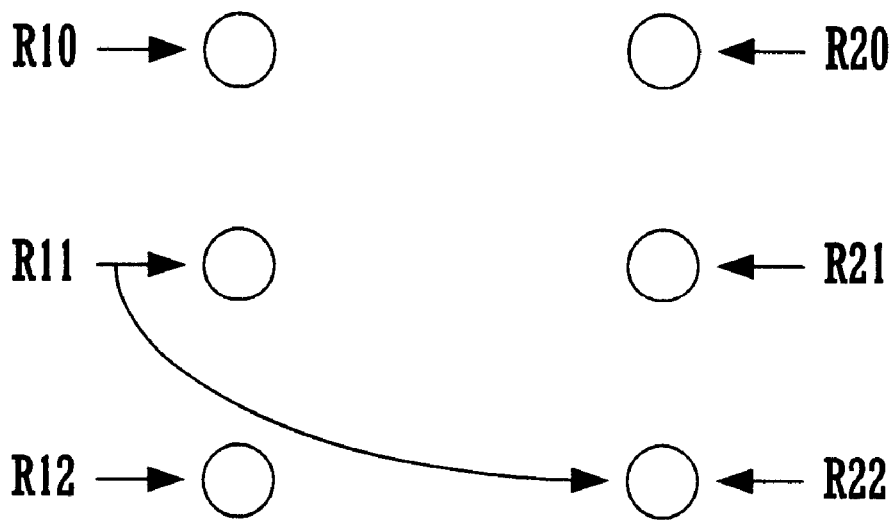
FIG. 1C shows a cross port data error of a third type, of which the present invention is designed to detect.
Figure 1D:
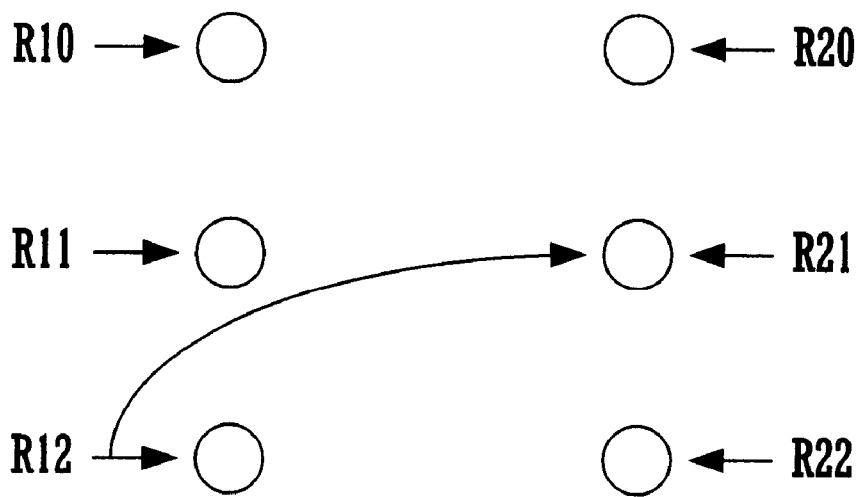
FIG. 1D shows a cross port data error of a fourth type, of which the present invention is designed to detect.
Figure 1E:
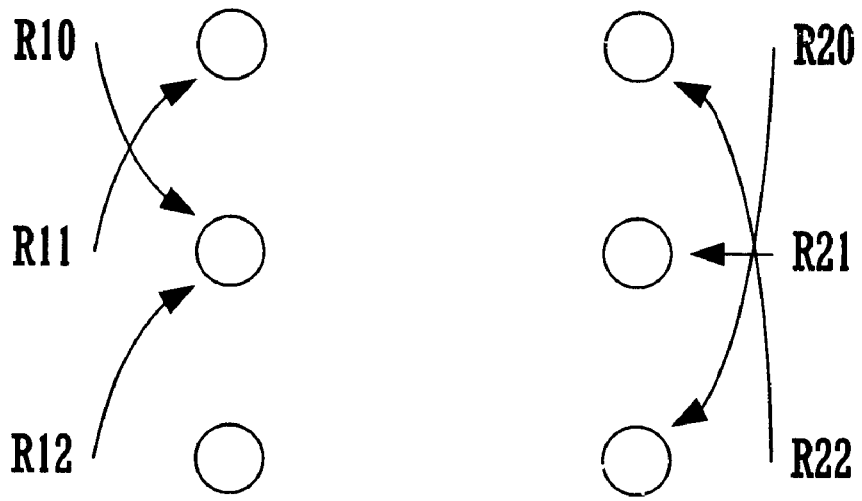
FIG. 1E shows a cross port data error of a fifth type, of which the present invention is designed to detect.

Referring now to FIGS. 1C and 1D, the faults CDF_G and CDF_H are respectively shown. These two faults are similar. In these faults the row wire of one port (R11) for a physical cell row connects also connects to the row wire of the other port (R22) for a different physical cell row in addition to its correct connection. In CDF_G fault shown in FIG. 1C, the row (R12) to which it connects to (R21) is at a higher address, while in CDF_H (FIG. 1D) it is at a lower address (R12 and R21).

The effect of these faults is a disturbed read in each column of whenever following conditions occur:

1. A cell in the coupling row is read using the first port.
2. A cell which has a different value than the cell in the coupled row in that column is read through the other port.

These two conditions will result into two cells being read onto a bit column at the same time, resulting in a read conflict. This can be detected by a read disturb. In accordance with the present invention, the following steps can be used to detect this fault:
1. Write a value d into a cell other than cell in the coupled row. All other cells in the array have a background value of "d".
2. A dual read from two ports, wherein one of the ports reads from the coupling row and the other reads the above cell.

Figure 2:
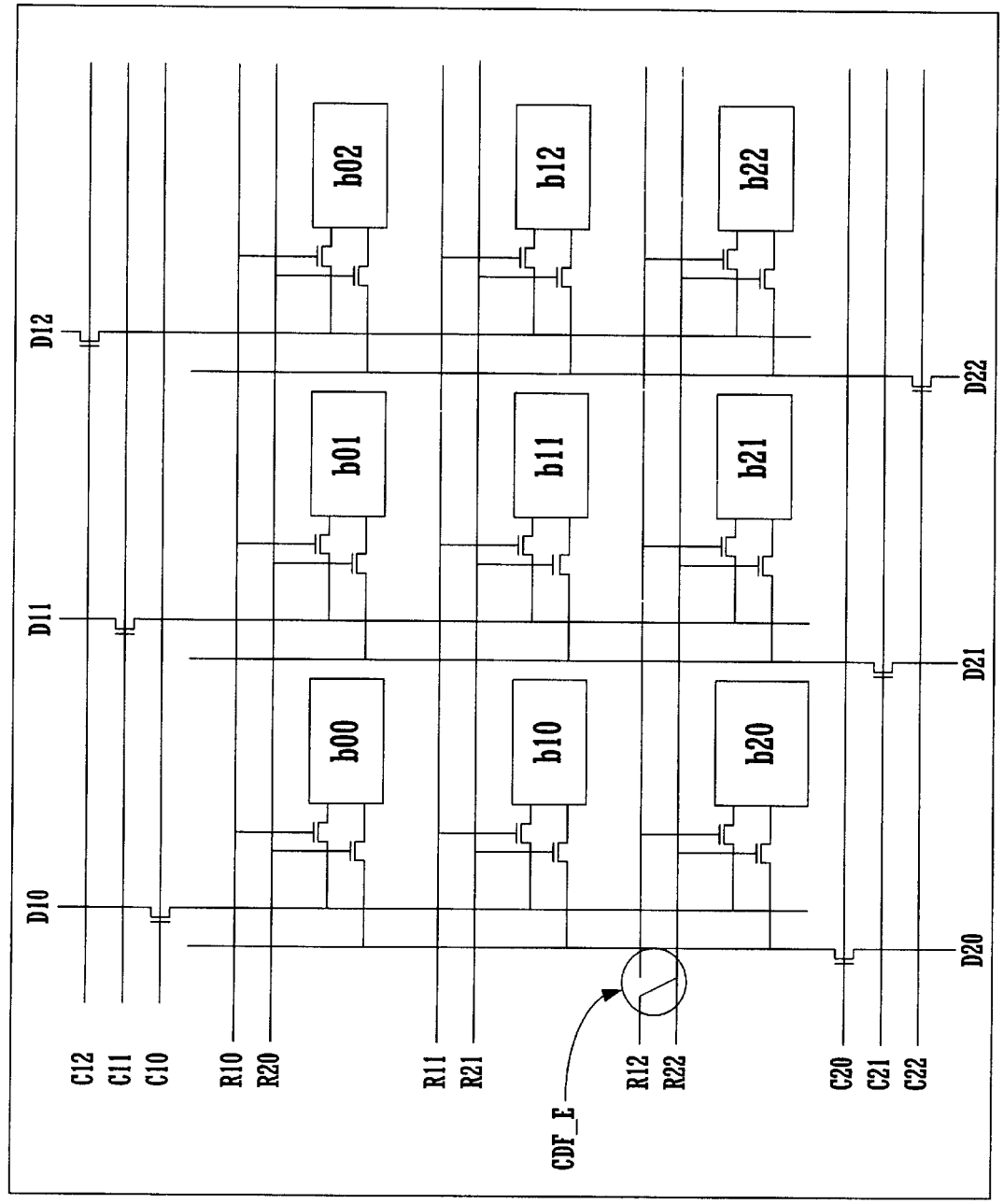
FIG. 2 shows a diagram of a CDF_E type fault which is detectable by the present invention.
Figure 3:
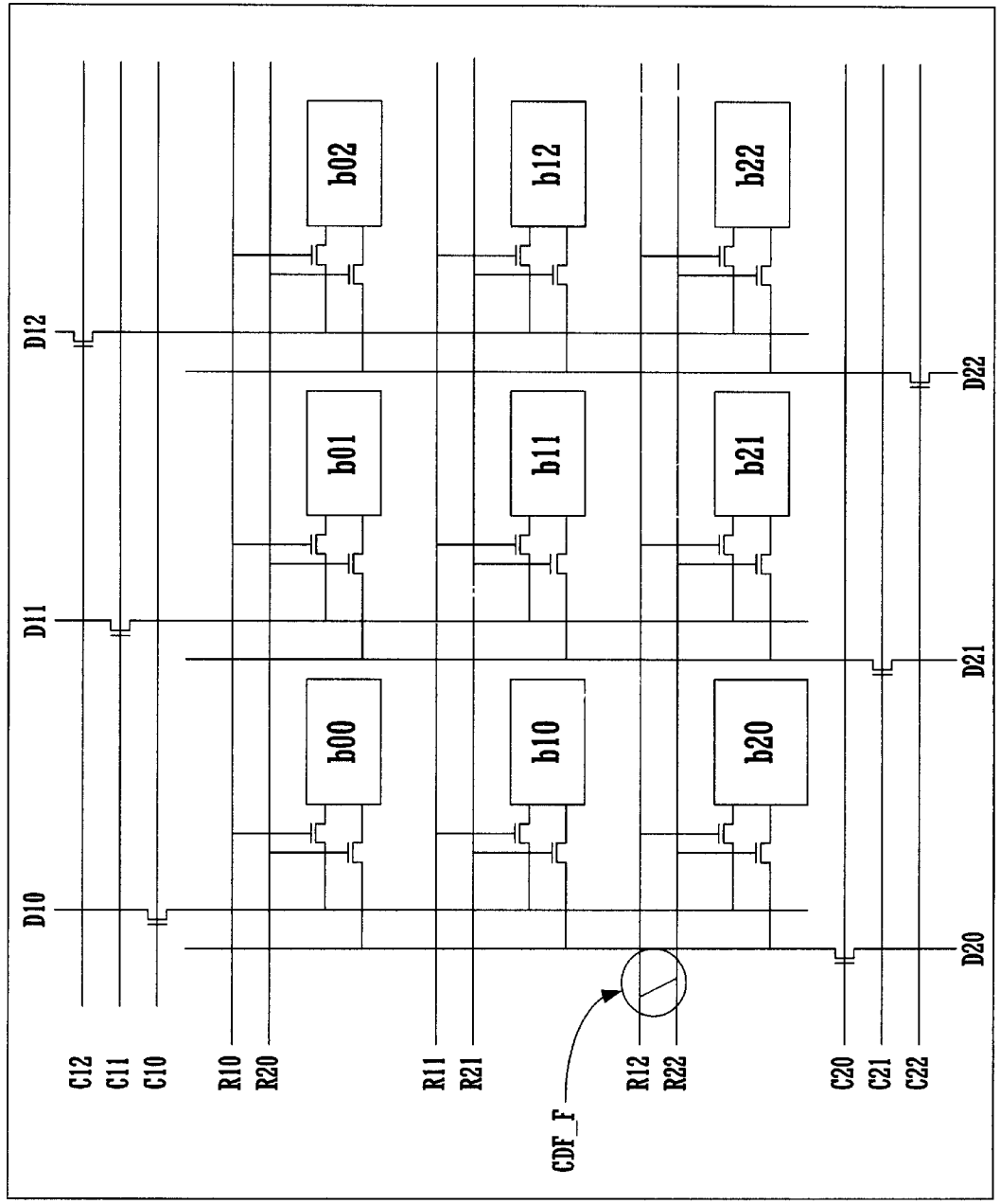
FIG. 3 shows a diagram of a CDF_F type fault which is detectable by the present invention.
Figure 4:
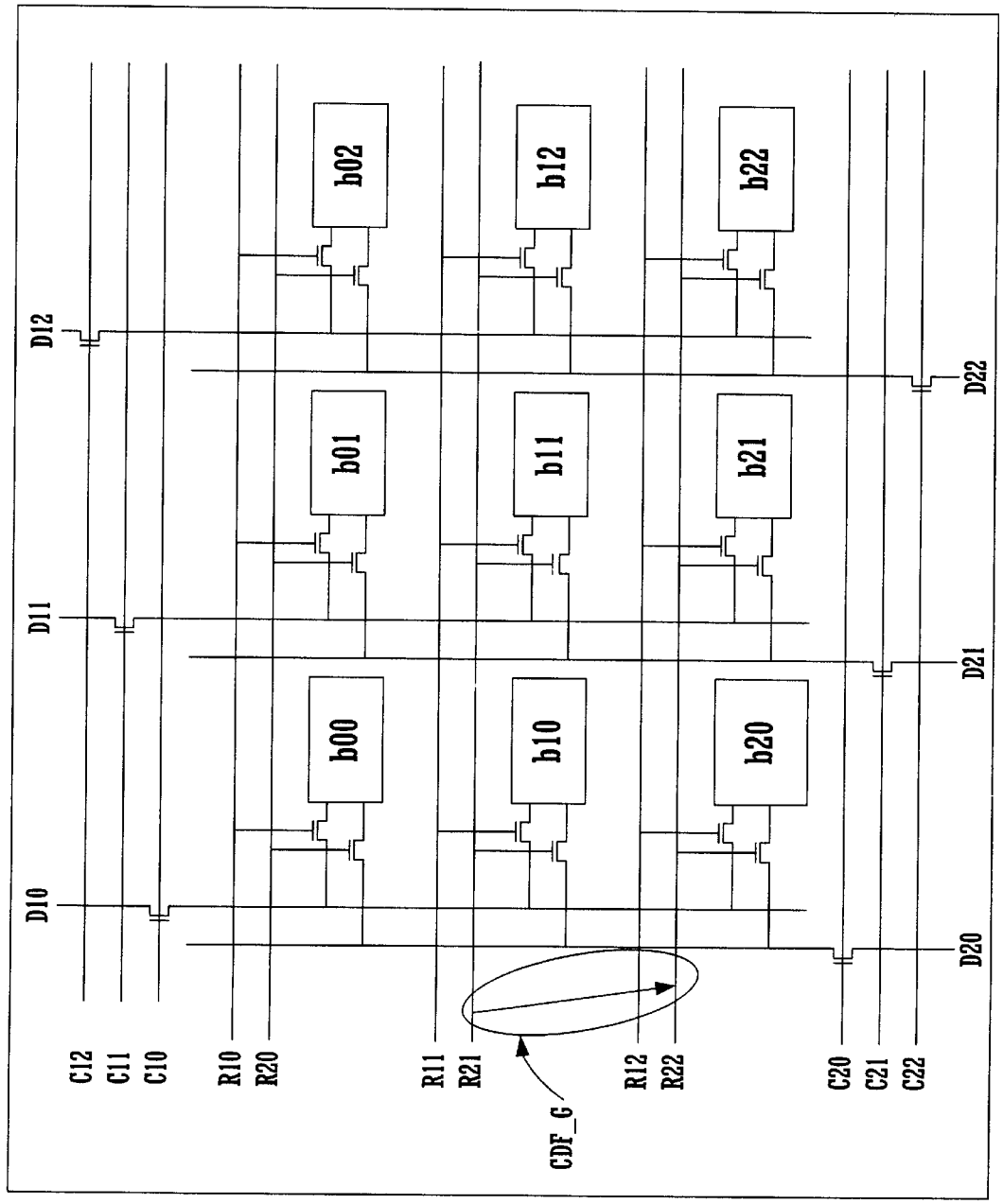
FIG. 4 shows a diagram of a CDF_G type fault which is detectable by the present invention.
Figure 5:
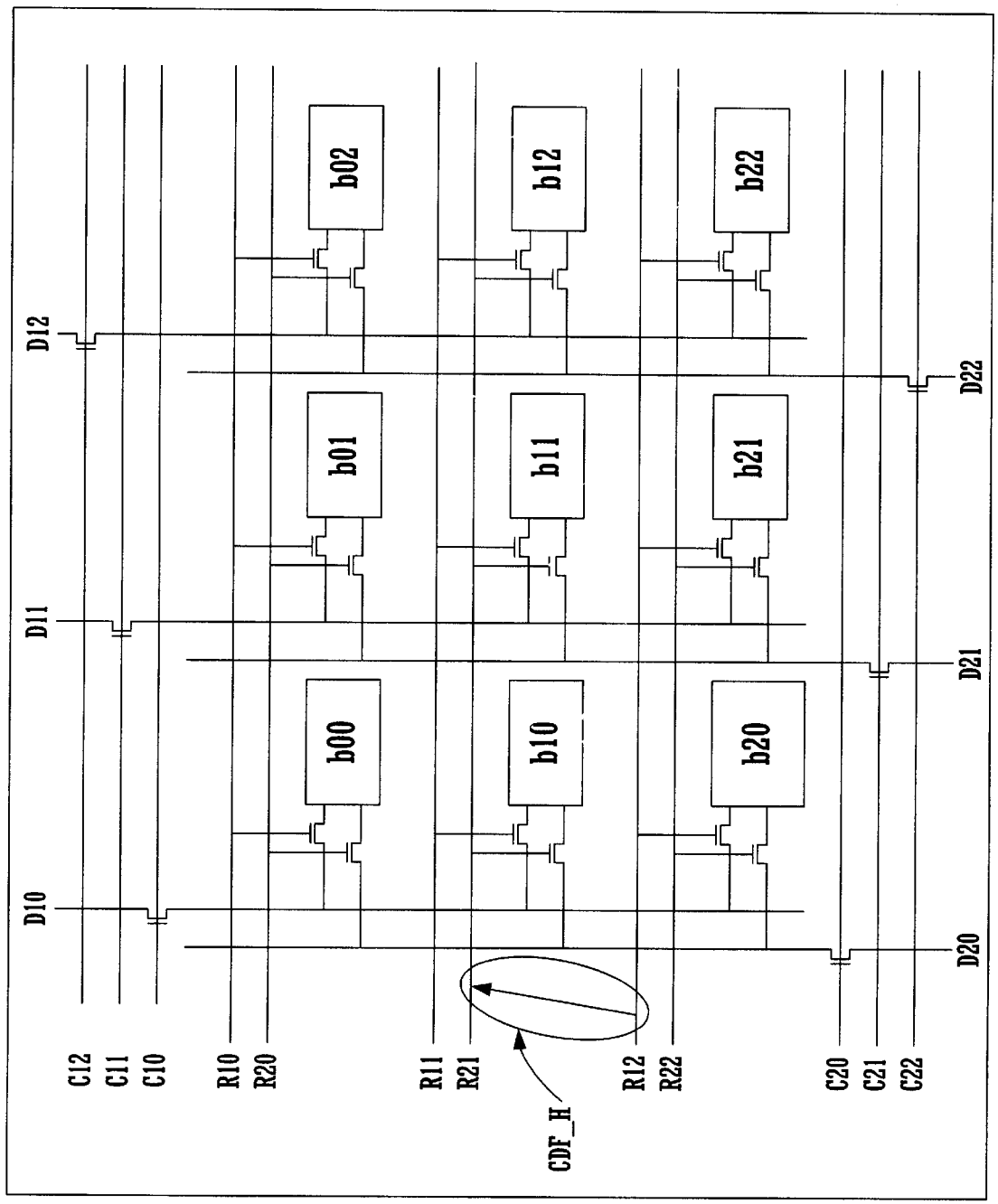
FIG. 5 shows a diagram of a CDF_H type fault which is detectable by the present invention.

The CDF_E fault is graphically depicted in FIG. 2, where the arrow labeled CDF_E shows the region of the integrated circuit where the relevant defect is located. As described above, an improper connection exists between the adjacent row wires R12 and R22. Similarly, FIG. 3 depicts the CDF_F fault, where the arrow labeled CDF_F indicates the defective region. FIG. 4 depicts the CDF_G fault, and FIG. 5 depicts the CDF_H.

Address Mismatch Faults

Figure 6:
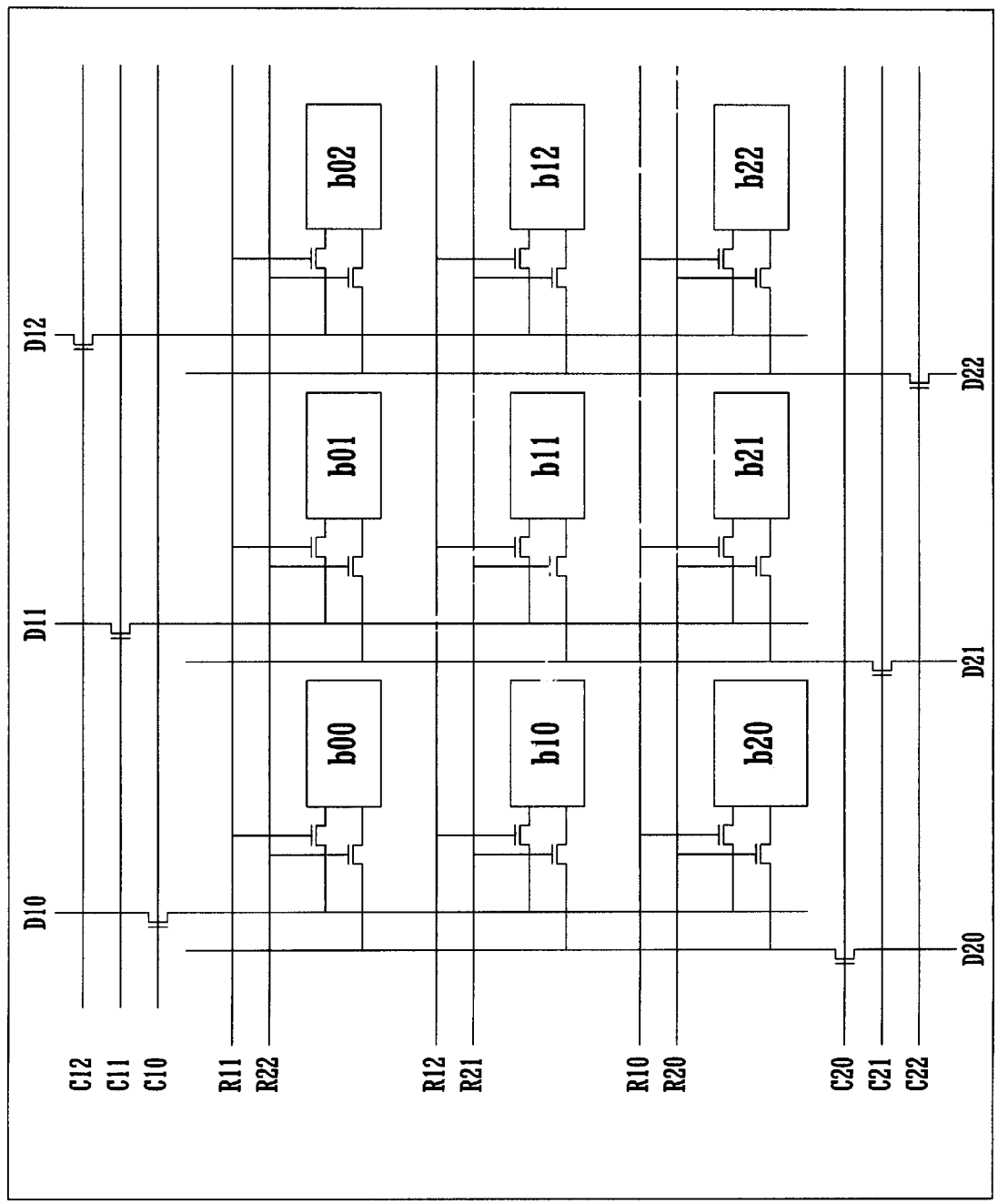
FIG. 6 shows a diagram of an address mismatch type fault which is detectable by the present invention.

FIG. 6 shows an address mismatch fault in a memory device. As depicted in FIG. 6, in this fault, the "address to row" mapping for two ports becomes different. This fault is indicated by the labels on the signal lines. It would occur outside of the diagram depicted in FIG. 6, and is the result of either a design error or a multiplex defect. This results in two ports accessing different physical cells for the same address. In accordance with the present invention, address mismatch faults are detected when a value is written into a cell, wherein the value is different than a value of all other cells in the RAM using that port, and then reading the same cell using all other port options.

Bit Shorts

Figure 7:
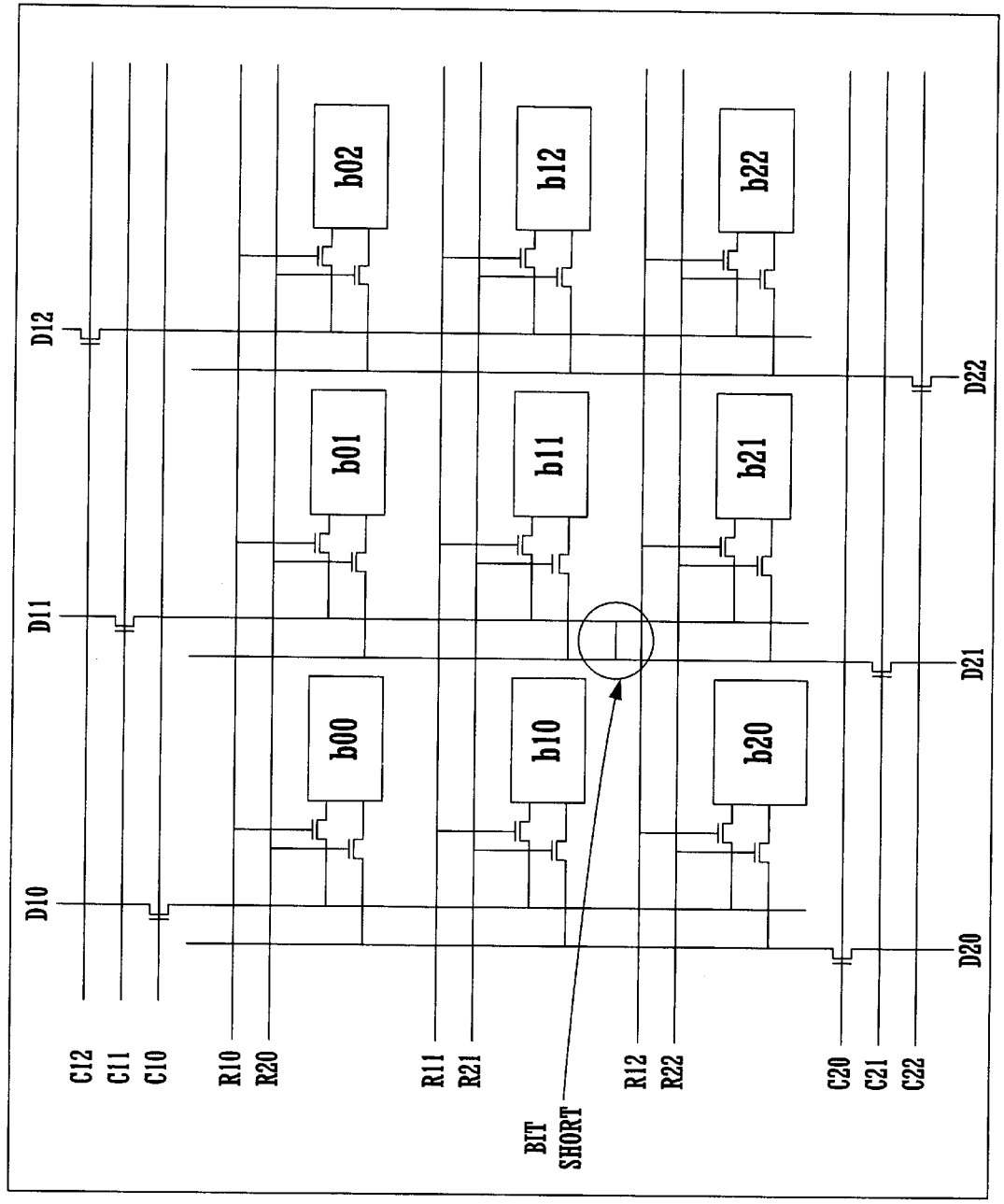
FIG. 7 shows a diagram of a bit short type fault which is detectable by the present invention.

Referring now to FIG. 7, a bit short fault is depicted. The defective area is shown by the arrow labeled bit short. In this type of faults the bit lines for the two ports in the same column get shorted which interfere with the simultaneous read/write to cells in the same column. The bit short fault are detected when two cells which have different values stored in them are read simultaneously from the same column. This test will have to be repeated with all possible pairings of the ports.

The Solution Provided by the Present Invention

The present invention provides a solution which detects the above types of faults. In accordance with the present invention, the requirements for detecting the above discussed faults (e.g., the targeted faults) can be consolidated into following two requirements:
1. Ability to write a cell through one port and reading that value through other ports.
2. Ability to read two cells with different values in the same column(row).

Of the above two requirements, first one does not need any special knowledge regarding placement and routing information of the memory. However, the second requirement is more difficult to fulfill if place and route information (e.g., on row/column/block placement of the memory cells within the memory device) is not available. In that case, the "GalPat" algorithm could be used wherein all the cells in the memory are read with reference to a base cell, which will guarantee that two cells with different values in the same column will be read some time during this reading phase. However GalPat has a $O(N^{**}2)$ complexity.

The algorithm of the present invention avoids $O(N^{**}2)$ complexity by noting the fact that one does not need to scan through all the cells in the memory to access two cells in the same column. Instead, if all the addresses which are at hamming distance of 1 from the base address are scanned, it will guarantee that at-least two cells in the same column (row) will be accessed during the scan.

As proof of the above, consider a case where A is an arbitrary address in a memory which has $N=2^{}n$ memory addresses such that A has n bits. Assuming that the memory is partitioned into $B=2^{}b$ blocks each of this block has $R=2^{}r$ rows and $C=2^{}c$ columns such that b+r+c=n as shown in FIG. 8.

Figure 8:
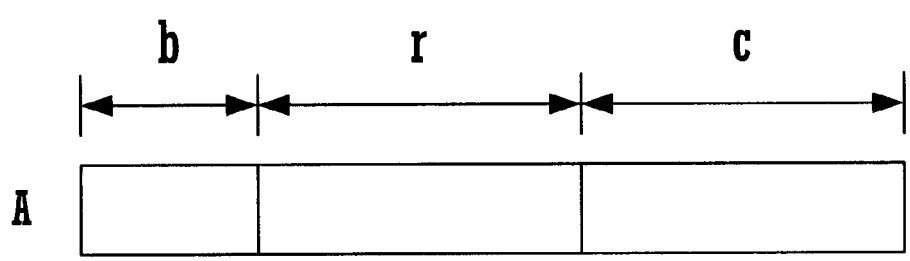
FIG. 8 shows a diagram of the fields of the addresses of a multiport memory device as used in the hamming process of the present invention.

Referring to FIG. 8, if b and c fields are kept constant, all the addresses that are at a hamming distance of 1 and that can be reaching by flipping one bit in the r field, will generate addresses that are in the same column in a block. Moreover, the exact number of addresses that are generated in that column is equal to r, the number of bits in the row filed. A similar argument applies to columns. Hence, if all the addresses that are at a hamming distance of 1 from a base address are generated, then the present invention is guaranteed to get at least two addresses that are in the same column(row) as the base address.

The Algorithm of the Present Invention

Referring now to FIG. 11, a pseudo code implementation of an algorithm 900 in accordance with one embodiment of the present invention is shown. This algorithm is for use with a dual-port memory. The notation used in this algorithm is as follows:
Rp (v,a): read a cell that is at address a using port p and expect a value v.
Wp (v,a): Write a cell that is at address a using port p with a value v.
(Rp(v1, a1), Rq(v2, a2)): means a simultaneous dual read on port p and q, where the read operations have same meaning as described above.
N: total number addresses in the memory. (full address space is assumed)

In the algorithm 900 of the present invention, steps 2 and 3 fill up the memory with a background pattern "b". Step 4 iterates through each memory cell. Step 5 writes a value opposite to the background in a cell that is selected in step 4. Steps 7–10 iterate through all the cells that at hamming distance of 1 from the address chosen in step 4, and perform a dual read on the base cell and all the cells selected by step 8. Step 11 resets the base cell to the background value. Step 13 repeats step 11 with the background value switched.

Detection of Fault

In accordance with the present invention, the above algorithm detects faults as follows:
CDF_E: This fault is detected by steps 5–6 which involve writing a value into a cell and reading it back through all the ports.
CDF_F: This fault will be detected by the step 9 when two cells are read in a column with different values in them (e.g., b20 and b10 in FIG. 3). The short between row decoder lines will enables the base cell on both the columns which will conflict with the read on some other cell with different value in the same column.
CDF_G and CDF_H: This fault will be detected by step 6 of algorithm 900. The condition for detection of this faults is that two cells in the same column with value different that one in the coupled row be read simultaneously. Out of these two cells one has to be from coupling row. The other cell could be any cell other than the one in the coupled row. Step 6 will put value of the base cell on both the bit columns. If the stated fault exist then the cell in the coupled row will also be enabled on one of the columns. Since this cell has a different value then the base cell, there will be a read disturb which can be detected.
Address Mismatch: This fault will also be detected by step 6. If there is a mismatch fault then the value read back by all the port will not be same.

Bit Shorts: Bit shorts will be detected by step 9 when two cells base and one other cell in the same column are read. If a fault exist then there will be read disturb as the two cells with different value being read.

The Complexity of the Present Invention

In this embodiment of the present invention, the inner loop executes LogN times for each of the N memory cells. This results in the complexity of algorithm to be O(NLogN). Algorithm 900 is an implementation for two port memories. However, algorithm 900 can be extended to multiport memories with more than two ports by simply modifying the steps 6 and 7 by performing a read operation not only on port 2 but all the remaining ports. Such an extension will detect all the faults across all the ports except for the bit-shorts. For bit shorts, the port which writes the foreground value has to be circulated to all the ports one by one and the algorithm be repeated. Algorithm 900 will have complexity NPLogN where P is the number of ports. If (P<<N) then the complexity would be O (NLogN).

Additionally, in accordance with the present invention, algorithm 900 can be readily implemented in hardware for BIST implementation. An implementation of Algorithm 900 using an address generator and a data generator in hardware is described.

Figure 9:
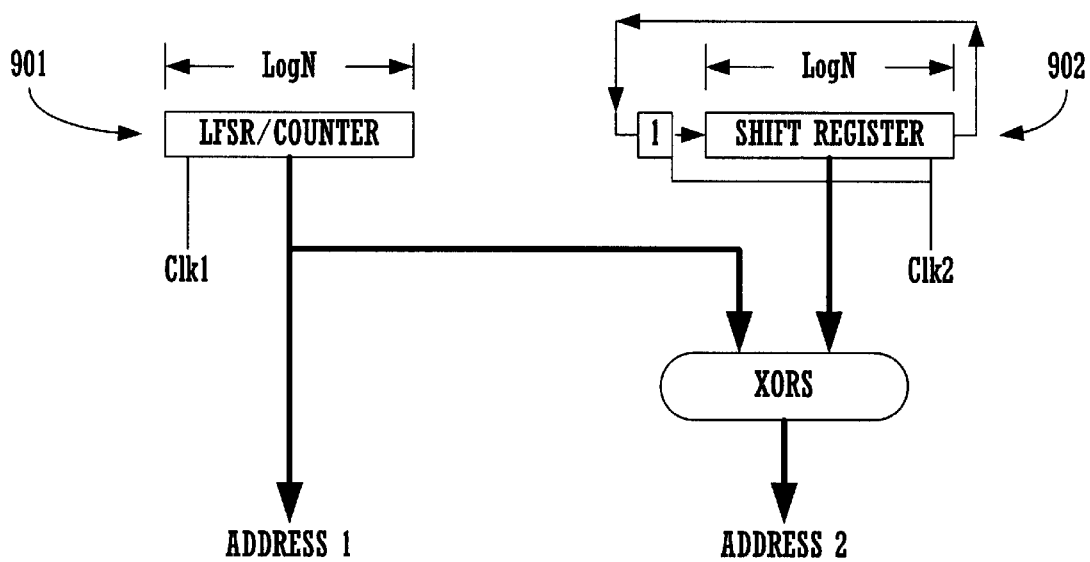
FIG. 9 shows a hardware implementation in accordance with one embodiment of the present invention used to build a BIST into a multiport memory device.

With reference now to FIG. 9, a hardware implementation of algorithm 900 is shown. FIG. 9 shows two address generators, LSFR/counter 901 and shift register 902. LSFR/counter 901 is operable to cycle through all the address in the memory for step 4 of algorithm 900. This can be easily implemented as an complete LFSR or a Binary counter. Shift register 902 has to generate the address which are at a hamming distance of 1 from the address in the first counter. These address can be easily generated using first counter, a shift register and an XOR network. The shift register 902 is a cyclic shift register of length LogN+1. Shift register 902 cycles a 1 through its stages. The lower LogN bit are XORed with the corresponding bit of the main counter to derive addresses for step 8.

Figure 10:
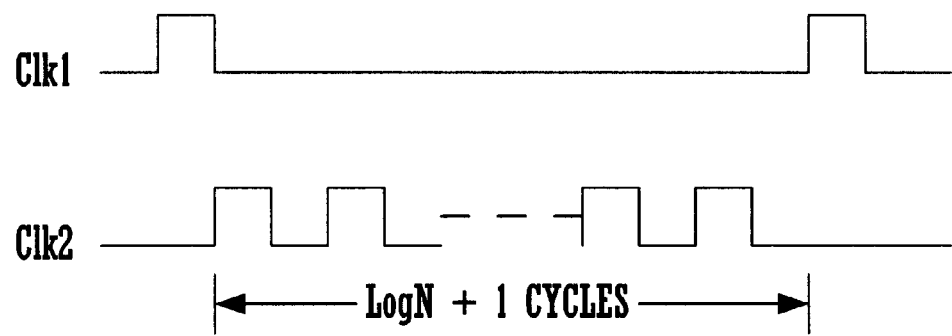
FIG. 10 shows a timing diagram for the operation of the hardware implementation of FIG. 9.

FIG. 10 shows the timing waveform for the these two address generators. If a memory has more than 2 ports then address 1 and address 2 shown in FIG. 9 can be connected to each port through the mux which can supply either address 1 or address 2. However, if detection of bit-shorts is not desired, these muxes will not be required. One port can be connected to address 1 and rest of the ports can be connected to address 2.

It should be noted that each port does not require its own data comparator. All the ports except the one being tested are expected to have same value. This characteristic can be used to generate an efficient comparator.

Thus, in summary, the present invention provides an efficient algorithm for testing mult-port memories. The algorithm of the present invention targets the various types of cross-port decoder faults, address mismatch faults, and bit shorts in multiport memories. This algorithm does not need any information on row/column/block placement in the memory. This characteristic makes the algorithm particularly flexible, greatly enhancing its usefulness in application the many different design environments in which this information is not available. As described above, the fact that detailed place and route information is not available in many applications renders many prior art testing algorithms inapplicable (because those algorithm assume availability of information on placement of row/column/block). The complexity of the algorithm of the present invention is O(NLogN), which may appear to be high compared to O(N) March algorithms. However, in those cases where LogN is computed for memories with 32 bit address space, it is just 32N. So the algorithm of the present invention is still much more practical than prior art algorithms. The hardware implementation of the algorithm is also amenable to the BIST (built in self test) implementations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a multiport memory semiconductor integrated circuit, an efficient method of testing the memory for faults, the method comprising the steps of:
   a) determining a base address in a multiport memory;
   b) scanning a plurality addresses in the memory which are at a hamming distance of 1 from the base address, such that at least two memory cells in each column of the memory cell are accessed in the scan; and
   c) detecting a fault in the memory wherein the fault is exposed when the two memory cells are accessed.

2. The method of claim 1, wherein step b) further includes the steps of:
   d) writing an initial value b to each memory cell of the multiport memory;
   e) after writing the initial value b to each memory cell, writing b' to each memory cell, wherein b' is the opposite value of b;
   f) reading b' from a first port of the multiport memory; and
   g) reading b' from a second port of the multiport memory.

3. The method of claim 2, further including the steps of:
   h) reaching all addresses in the multiport memory that are in the same column in the memory by flipping one bit in a series of read addresses such that each of the read addresses are at a hamming distance of 1 from the base address; and
   i) performing steps f) and g) for each read address.

4. The method of claim 3, wherein steps h) and i) are operable to detect cross port decoder faults in the multiport memory.

5. The method of claim 2, wherein steps b) and c) are repeated with the values of b and b' reversed.

6. The method of claim 1, wherein the multiport memory is two port memory.

7. The method of claim 1, wherein steps a), b), and c) are implemented as a hardware based BIST (built in self test) using a first and second address counter built into the multiport memory.

8. In a multiport memory semiconductor integrated circuit, an efficient hardware BIST (built in self test) method for testing the multiport memory for faults without requiring placement and routing information about the multiport memory semiconductor integrated circuit, the method comprising the steps of:
   a) determining a base address in a multiport memory;
   b) scanning a plurality addresses in the memory which are at a hamming distance of 1 from the base address, such that at least two memory cells in each column of the memory cell are accessed in the scan; and c) detecting a fault in the memory wherein the fault is exposed when the two memory cells are accessed, wherein steps a), b), and c) are implemented using a first and second address counter built into the multiport memory.

9. The method of claim 8, wherein step b) further includes the steps of:

d) writing an initial value b to each memory cell of the multiport memory;

e) after writing the initial value b to each memory cell, writing b' to each memory cell, wherein b' is the opposite value of b;

f) reading b' from a first port of the multiport memory; and g) reading b' from a second port of the multiport memory.

10. The method of claim 9, further including the steps of:

h) reaching all addresses in the multiport memory that are in the same column in the memory by flipping one bit in a series of read addresses such that each of the read addresses are at a hamming distance of 1 from the base address; and i) performing steps f) and g) for each read address.

11. The method of claim 10, wherein steps h) and i) are operable to detect cross port decoder faults in the multiport memory.

12. The method of claim 11, wherein steps h) and i) are operable to detect address mismatch faults in the multiport memory.

13. The method of claim 11, wherein steps h) and i) are operable to detect bit short faults in the multiport memory.

14. The method of claim 9, wherein steps b) and c) are repeated with the values of b and b' reversed.

15. The method of claim 8, wherein the multiport memory is two port memory.

16. The method of claim 8, wherein steps a), b), and c) are implemented as a hardware based built in self test using the first and second address counters built into the multiport memory, and wherein the second address counter is configured to generate addresses that are at a hamming distance of 1 away from addresses generated by the first address counter.

17. A system for efficiently testing a multiport memory for faults without requiring placement and routing information about the multiport memory semiconductor integrated circuit, the system adapted to couple to the multiport memory semiconductor integrated circuit and implement a testing method comprising the steps of:

a) determining a base address in a multiport memory;

b) scanning a plurality addresses in the memory which are at a hamming distance of 1 from the base address, such that at least two memory cells in each column of the memory cell are accessed in the scan; and c) detecting a fault in the memory wherein the fault is exposed when the two memory cells are accessed.

18. The system of claim 17, wherein step b) further includes the steps of:

d) writing an initial value b to each memory cell of the multiport memory;

e) after writing the initial value b to each memory cell, writing b' to each memory cell, wherein b' is the opposite value of b;

f) reading b' from a first port of the multiport memory; and g) reading b' from a second port of the multiport memory.

19. The system of claim 18, wherein steps h) and i) are operable to detect cross port decoder faults in the multiport memory.

20. The system of claim 18, wherein steps b) and c) are repeated with the values of b and b' reversed.

21. The system of claim 17, further including the steps of:

h) reaching all addresses in the multiport memory that are in the same column in the memory by flipping one bit in a series of read addresses such that each of the read addresses are at a hamming distance of 1 from the base address; and i) performing steps f) and g) for each read address.

22. The system of claim 21, wherein steps h) and i) are operable to detect address mismatch faults in the multiport memory.

23. The system of claim 21, wherein steps h) and i) are operable to detect bit short faults in the multiport memory.

24. The system of claim 17, wherein the multiport memory is two port memory.

* * * * *